United States Patent
Nees et al.

(10) Patent No.: US 10,809,622 B2
(45) Date of Patent: Oct. 20, 2020

(54) EMBOSSING LACQUER AND METHOD FOR EMBOSSING, AND SUBSTRATE SURFACE COATED WITH THE EMBOSSING LACQUER

(71) Applicant: Joanneum Research Forschungsgesellschaft mbH, Graz (AT)

(72) Inventors: Dieter Nees, Thannhausen (AT); Christoph Auner, Graz (AT); Barbara Stadlober, Graz (AT); Stephan Ruttloff, Weiz (AT); Maria Belegratis, Pischelsdorf (AT)

(73) Assignee: Joanneum Research Forschungsgesellschaft mbH, Graz (AT)

(*) Notice: Subject to any disclaimer, the term of this patent is extended or adjusted under 35 U.S.C. 154(b) by 41 days.

(21) Appl. No.: 15/534,357

(22) PCT Filed: Dec. 9, 2015

(86) PCT No.: PCT/AT2015/000156
§ 371 (c)(1),
(2) Date: Jun. 8, 2017

(87) PCT Pub. No.: WO2016/090394
PCT Pub. Date: Jun. 16, 2016

(65) Prior Publication Data
US 2017/0343900 A1     Nov. 30, 2017

(30) Foreign Application Priority Data

Dec. 10, 2014 (AT) .................................. A 887/2014

(51) Int. Cl.
*G03F 7/42* (2006.01)
*G03F 7/00* (2006.01)
(Continued)

(52) U.S. Cl.
CPC ............ *G03F 7/423* (2013.01); *G03F 7/0002* (2013.01); *G03F 7/027* (2013.01); *G03F 7/029* (2013.01);
(Continued)

(58) Field of Classification Search
CPC ........ G03F 7/423; G03F 7/0002; G03F 7/027; G03F 7/0275; G03F 7/031; G03F 7/075;
(Continued)

(56) References Cited

U.S. PATENT DOCUMENTS

2005/0147768 A1*  7/2005  Hashimoto ............... C08J 7/047
                                                             428/1.6
2005/0187339 A1   8/2005  Xu et al.
(Continued)

FOREIGN PATENT DOCUMENTS

EP      2244281 A1      10/2010
EP      2286980 A1      2/2011
(Continued)

*Primary Examiner* — Ruiyun Zhang
(74) *Attorney, Agent, or Firm* — Duane Morris LLP

(57) ABSTRACT

In the case of an embossing lacquer based on a UV-polymerizable prepolymer composition containing at least one acrylate monomer, the prepolymer composition—in addition to the acrylate monomer—contains at least one thiol selected from the group: 3-Mercaptopropianates, mercaptoacetates, thioglycolates, and alkylthiols as well as potentially a surface-active anti-adhesive additive selected from the group of anionic surfactants, such as polyether siloxanes, fatty alcohol ethoxylates, such as polyoxyethylene (9) lauryl ethers, monofunctional alkyl (meth)acrylates, polysiloxane (meth)acrylates, perfluoroalkyl (meth)acrylates, and perfluoropolyether (meth)acrylates as well as a photoinitiator, as well as a method for imprinting substrate surfaces coated with an embossing lacquer.

8 Claims, 3 Drawing Sheets

Figure 1A:
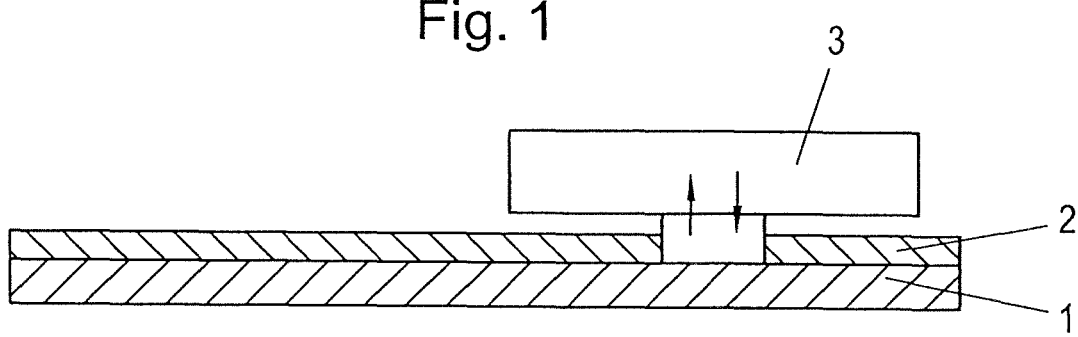

(51) Int. Cl.
- *G03F 7/027* (2006.01)
- *G03F 7/029* (2006.01)
- *G03F 7/031* (2006.01)
- *G03F 7/075* (2006.01)
- *G03F 7/085* (2006.01)
- *G03F 7/40* (2006.01)

(52) U.S. Cl.
CPC ............ *G03F 7/0275* (2013.01); *G03F 7/031* (2013.01); *G03F 7/0751* (2013.01); *G03F 7/085* (2013.01); *G03F 7/40* (2013.01); *G03F 7/425* (2013.01); *Y10T 428/105* (2015.01); *Y10T 428/1036* (2015.01); *Y10T 428/1045* (2015.01)

(58) Field of Classification Search
CPC .... G03F 7/0751; G03F 7/085; Y10T 428/105; Y10T 428/1045; Y10T 428/1036; Y10T 428/10
USPC ..... 428/1.1, 1.3, 1.32, 1.33, 195.1; 264/401; 430/126.1
See application file for complete search history.

(56) References Cited

U.S. PATENT DOCUMENTS

| | | | |
|---|---|---|---|
| 2006/0216500 A1* | 9/2006 | Klun | .................. C08G 18/3825 428/336 |
| 2008/0014513 A1* | 1/2008 | Sisler | .................. G03G 7/0006 430/11 |
| 2008/0176049 A1 | 7/2008 | Ro et al. | |
| 2010/0109195 A1 | 5/2010 | Xu et al. | |
| 2010/0109317 A1 | 5/2010 | Hoffmueller | |
| 2011/0281025 A1 | 11/2011 | Arai et al. | |
| 2012/0100369 A1* | 4/2012 | Hanazawa | ........ B29C 45/14827 428/352 |
| 2016/0009946 A1 | 1/2016 | Kitagawa et al. | |

FOREIGN PATENT DOCUMENTS

| | | | |
|---|---|---|---|
| GB | 2003494 A | | 3/1979 |
| GB | 2089581 A | | 6/1982 |
| JP | 2014074082 A | * | 4/2014 |
| JP | 2014074082 A | | 4/2014 |
| JP | 2015071741 A | | 4/2015 |
| KR | 20080028786 A | | 4/2008 |
| WO | 2013174522 A1 | | 11/2013 |

* cited by examiner

Fig. 3
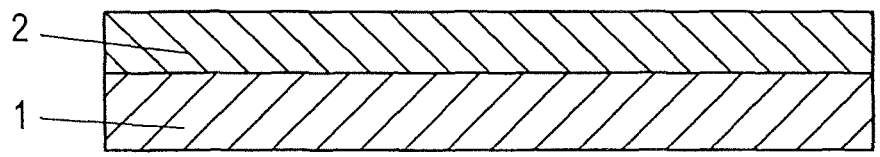
Fig. 3a
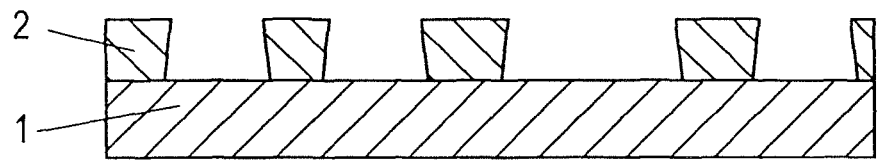
Fig. 3b
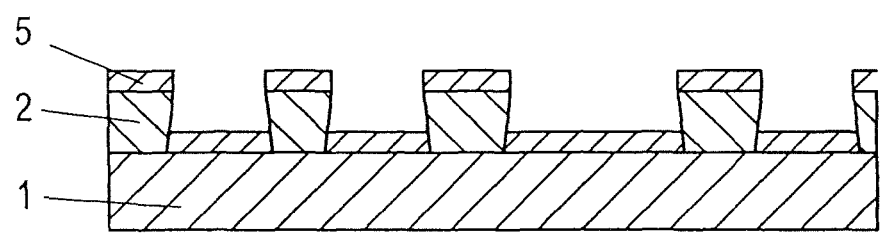
Fig. 3c
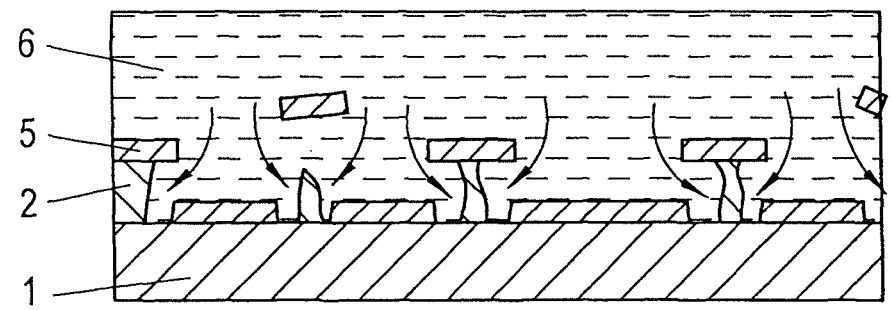
Fig. 3d
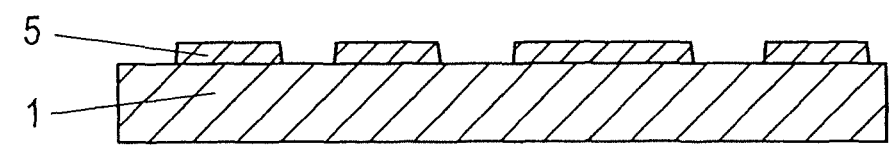
Fig. 3e

EMBOSSING LACQUER AND METHOD FOR EMBOSSING, AND SUBSTRATE SURFACE COATED WITH THE EMBOSSING LACQUER

The present invention relates to an embossing lacquer based on a UV-polymerizable prepolymer composition containing at least one acrylate monomer, as well as a method for embossing a substrate surface coated with an embossing lacquer based on a UV-polymerizable prepolymer composition containing at least one acrylate monomer.

Due to the rapid rise of nanotechnology in recent years, the production of nanostructured components in industrial manufacturing is noticeably gaining in importance, wherein these nanostructured components are typically manufactured from photopolymerizable prepolymer compositions. Finest structures are increasingly used to achieve specific additional functionalities, e.g. to evoke decorative visual effects, particularly in the area of décor, product marketing, and the surface finishing of various materials, such as foils. For this purpose, structures processed through nanotechnology, which are produced from special prepolymer compositions, are used.

An even more significant purpose of these micro and nanostructured foils is with electronic, optical, sensory, and magnetic components, such as integrated circuits, displays, micro-optics, etc., as small structural sizes are the decisive factor for the functionality of these elements and, thus, enormous efforts are being made in the field of extensively printed electronics to manufacture components on foil substrates. Thus, for industrial foil manufacturing, micro and nanostructuring techniques, such as imprint technologies, play an important role and demand ever new and improved moldable foils or compositions, from which these structured foils can be manufactured.

Industrial foil finishing encompasses a very large area, which ranges from the enhancement of mechanical or decorative surface features to the integration of optical, sensory, and electronic functionalities in the material foil. A crucial criterion and simultaneously a limiting component for the use of these production techniques, however, is the fact that products frequently have structures with dimensions in the lower micrometer or nanometer range—on the one hand due to the high integration density of their individual components as well as to ensure the functionality of the structures in the size of the used wavelength and to enlarge the surfaces overall. While conventional mass printing processes, such as gravure printing, flexographic printing, offset printing, etc. enable an extremely high throughput of several 100 meters per minute; they are usually not capable of providing the necessary structural resolution area. They only currently known technology that enables structures to be manufactured with minimal dimensions in the nanometer range in a parallel process is so-called nanoimprint lithography (NIL), which presents a highly precise embossing process and with which it is possible to form even the smallest structures on the respective substrate.

A form consisting of a molded resin as well as a method for producing this was already revealed in EP 2 286 980 A1, with which robust and simultaneously fine structures can be formed on a surface. A photohardenable resin composition that can be used for developing the form contains a polymerization indicator as well as a respective photopolymerizable monomer.

To date, nanoimprint lithography processes have primarily been used industrially for the production of embossed holograms. Similar processes are therefore used in the nanoimprint lithography processes, wherein the embossed structures form a surface relief that acts as diffraction grating. It is crucial with these processes that the embossing lacquer is prevented from adhering to the imprinting tool in order to then be able to achieve a defect-free demolding of the imprinted object.

Two different types of imprinting tools are currently being used for one nanoimprint method. Tools consisting of silicon, quartz or nickel are now being used as these imprinting tools, wherein the production of these hard imprinting tools is relatively complicated. Thus, efforts are being made to replace the hard embossing stamps with embossing stamps consisting of polymer materials, wherein polymer materials potentially have lower surface energies than silicon, quartz or nickel, which reduces the adhesion of the embossing lacquer during the imprinting process. However, they often have the disadvantage of only being able to be used to a limited extent as embossing stamps in the submicrometer range and integrated polymer materials do not sufficiently harden quickly enough in the imprinting process, and therefore their imprinting accuracy is relatively minimal, such that defect-free self-replication of the stamp in an imprinting process does not seem possible with currently available embossing lacquers. For imprinting, not only is the complete conversion of reactive C—C double bonds in the polymer stamp material necessary prior to imprinting as otherwise they react with the C—C double bonds in the utilized embossing lacquer, which inevitably causes adhering of the stamp and embossing lacquer. However, particularly with small structures, such as in the nanometer range, any adhering of the stamp and embossing lacquer or any incomplete removal of the imprinted structure from the tool must be avoided at all costs as otherwise molding with a required structural accuracy is not possible and desired structures cannot be manufactured with this shape accuracy in order to be able to be used industrially. Therefore, surface features or interfacial energies between a substrate, the stamp, and the embossing lacquer are crucial. Residue-free demolding seems only possible if the embossing lacquer demonstrates a strong tendency to withdraw from the stamp surface during the nanoimprint process.

Thus, the present invention aims to provide a soluble embossing lacquer based on a UV-polymerizable prepolymer composition, with which it is possible to manufacture structures in the nanometer range and which are free of irregularities. The invention also aims to provide a method for imprinting substrate surfaces coated with this embossing lacquer, with which it is possible to produce structures capable of self-molding in the nanometer range of the embossing lacquer, which have a high molding accuracy and which enable defect-free nanostructures to be produced in a continual nanolithography process.

To achieve this goal, an embossing lacquer according to the invention is primarily distinguished by the fact that the prepolymer composition—in addition to the acrylate monomers—contains at least one thiol selected from the group: 3-Mercaptopropionates, mercaptoacetates, thioglycolates, and alkyl thiols as well as potentially a surface-active anti-adhesive additive selected from the group of anionic surfactants, such as polyether siloxanes, fatty alcohol ethoxylates, such as polyoxyethylene (9) lauryl ethers, monofunctional alkyl (meth)acrylate, polysiloxane (meth)acrylates, perfluoroalkyl (meth)acrylates, and perfluoropolyether (meth)acrylates, as well as a photoinitiator. Due to the fact that the prepolymer composition according to the invention—in addition to the acrylate monomers—contains at least one thiol selected from the group of 3-Mercaptopropionates, mercaptoacetates, thioglycolates, and alkylthiols, peroxy radicals hydrogen atoms developing during polymerization in the event of lacking preclusion of $O_2$ will abstract from the thiol groups while forming thionyl radicals, which in turn add to the carbon-carbon double bonds and initiate a polyaddition reaction, through which chain termination is prevented and the reaction speed is significantly increased and particularly UV-polymerization is rapidly continued, which leads overall to an increase of the polymerization speed. The addition of thiol causes an increased chain transfer with radical polymerization or enables a parallel polyaddition reaction, through which it is possible to trigger the simultaneous growth of several reaction centers, which in turn leads to lower molecular weights or polymer chain lengths and thus enhanced solubility of the polymers formed thereof.

In particular, the contraction inevitably occurring during polymerization already in the liquid state of the UV-polymerizable prepolymer composition occurs through the use of the thiol, through which the mold accuracy in an imprinting process—particularly a UV-imprinting process—is considerably improved compared to conventional materials and particularly the contraction impacting imprinting accuracy is considerably minimized compared to conventional UV-imprinting polymers. When using a surface-active anti-adhesive additive, the adhesive energy, i.e. the adhesion between the embossing lacquer and a shim or stamp is considerably reduced during subsequent use, which enables a residue-free separation or residue-free release of the two materials from each other.

The embossing lacquer according to the invention has a particularly low viscosity, which enables the rapid filling of cavities in the imprinting tool and the molding of nanostructures. The surface energy and/or the interfacial energy of the embossing lacquer are controllable through the addition of surface-active additives and thus the wetting behavior of the embossing lacquer as well.

In doing so, the embossing lacquer according to the invention enables a direct lift-off structuring of layers vapor-deposited in a second step because the embossing lacquer can be completely removed, such that no residual embossing lacquer layer remains between the sacrificial embossing lacquer structures on the substrate foil. Thus, removing residual embossing lacquer, e.g. through time-consuming $O_2$ reactive-ion etching, is spared when utilizing the embossing lacquer.

Due to the fact that—as corresponds to a design of the invention—the embossing lacquer is designed in such a manner that acrylate monomers from the group of acryloyl-morpholine (ACMO) or isobornyl acrylate (IBOA) is selected, an extremely small, movable, reactive monomer is used as an acrylate monomer, through which the polymerization speed can be highly increased overall and a particularly rapid hardening, and thus a high mold accuracy of the embossing lacquer, can be ensured.

To keep the degree of polymerization of the composition forming the embossing lacquer during UV imprinting/solidification as low as possible, and therefore to maximize the solubility or dissolving speed, the embossing lacquer according to the invention is designed, such that the thiol is contained in the prepolymer composition in a quantity of 0.5 and 20 wt %. With this design, it is possible to keep the contraction impacting imprint accuracy occurring during polymerization as minimal as possible.

In order to particularly keep adhesion of the embossing lacquer as minimal as possible or to fully prevent this during or after UV polymerization of the prepolymer composition forming it on surfaces, for example, on a nickel shim surface, the invention is designed, such that the surface-active additive is an additive containing silicone or fluoride selected from the group of anionic surfactants, such as polyether siloxanes, fatty alcohol ethoxylates, such as polyoxy-ethylene (9) lauryl ethers, monofunctional polydimethyl siloxane (meth)acrylates, perfluoro-n-alkyl (meth) acrylates or perfluoropolyether(meth) acrylates, which is contained particularly in a quantity of 0.1 to 3 wt %. Additives containing silicone or fluoride contribute to the reduction of adhesion and to easing the removal of the embossing lacquers formed from the prepolymer composition from the imprinting tool, wherein particularly the perfluorinated additives have proven to be particularly beneficial and reliably enable several moldings of a design.

Due to the fact that—as corresponds to a design of the invention—the photoinitiator contained in the prepolymer composition forming in the embossing lacquer is selected from the group of thioxanthones, ketosulfones, (alkyl)benzoyl phenyl phosphine oxide, 1-Hydroxy alkyl phenyl ketone or 2,2-Dimethoxy-1,2-diphenylethane-1-one, it is possible to effectively initiate polymerization.

Due to the fact that—as corresponds to a design of the invention—the photoinitiator is contained in a quantity of 0.1 to 10 wt %, particularly 0.5 to 5 wt %, the polymerization speed of the composition forming the embossing lacquer can be controlled in a targeted manner. In general, it can be stated that the higher the concentration of the photoinitiator, the greater is the polymerization speed in the utilized diluted layers, such that particularly a quantity of 0.5 to 5 wt % of the photoinitiator has proven to be beneficial for polymerization with respect to the use according to the invention.

To design an embossing lacquer having a particularly high polymerization speed as well as a low degree of polymerization, the invention provisions that the thiol is selected from a mono or dithiol of the group: octanethiol, 1,8-Octanedithiol, decanethiol, 1,10-Decanedithiol, dodecanethiol, 1,12-Dodecanedithiol, 2-Ethylhexyl mercaptoacetate, 2-Ethylhexyl-3-mercaptopropionate, 2-Ethylhexyl thioglycolate, glycol di(3-mercaptopropionate), glycol di(mercaptoacetate), glyceryl dimercaptoacetate or glyceryl di(3-mercaptopropionate).

To ensure residue-free imprinting of the embossing lacquer, the invention provisions that the prepolymer composition has a viscosity between 10 and 100 mPas.

Furthermore, the invention relates to a method for imprinting a substrate surface coated with an embossing lacquer according to the invention, wherein—in the present case—it is evident that the method according to the invention can be conducted in a multitude of ways without the result according to the invention being changed. The goal of this method is to form or produce nanostructured surfaces or structures and to mold these structures several times with a conventional molding process or imprint process.

To achieve this goal, a method according to the invention is primarily distinguished by the following steps:

a) Application of a layer of embossing lacquer on a carrier, b) UV structuring of the embossing lacquer, c) Potential application of at least one additional layer to be structured selected from a metal, semiconductor, and/or dielectric layer, d) Removal of the embossing lacquer remaining after structuring in step b) with potential additives selected from diluted acids with pH values in the range of 1 to 6, diluted lyes with pH values in the range of 8 to 13 or water containing surfactants or propylene glycol monomethyl ether acetate (PGMEA), N-methyl-2-pyrrolidone (NMP), methyl ethyl ketone (MEK) or acetone.

Due to the fact that the first two steps are conducted by the method according to the invention, it is possible to produce a nanostructured embossing lacquer layer as a sacrificial layer, which can either be metalized or coated with another layer and subsequently the remaining structures of embossing lacquer can be removed with water or organic solvents, such as PGMEA. It is preferable with this method that the embossing lacquer based on ACMO is soluble in water, diluted acids or lyes or specific solvents, such that the application of toxic or highly corrosive chemicals can be avoided in any case and a nanostructure can still be extensively formed with this method.

To achieve a precisely reproducible structuring of the surface of the embossing lacquer or even a precise structuring of the metalized surfaces thereof, the method according to the invention is largely conducted in such a way that UV structuring of the embossing lacquer is conducted with a UV nanoimprint lithography method.

Due to the fact that—as corresponds to a design of the invention—the additional layer to be structured consisting of metals, such as nickel, aluminum, chromium or titanium, conjugated organic semiconductors, such as pentazen, C60, thiophene, DNTT; P3HT, phthalocyanine, hydrogen bridge-bonded organic semiconductors, such as indigo and indigo derivatives as well as quinacridone and anthraquinone, inorganic semiconductors, such as ZnO, SnO, InGaZnO or dielectrics selected from polynorbornene, ormocer, cellulose, PVCi, BCB, PMMA, shellac, polyimide, Cytop, PVDF, PVDF-TrFE, polystyrenes, $Al_2O_3$, $ZrO_2$, $SiO_2$, SiON, $Si_3N_4$, as well as combinations thereof, is to be applied, with which layers a defect-free removal can be achieved.

Particularly positive results can be achieved by the fact that the method is conducted in such a way that the additional metal, semiconductor, and/or dielectric layer to be structured is applied with a layer thickness between 5 nm and 500 nm, wherein the thickness of the layer to be structured should be less than ⅓ of the structured.

The removal of the remaining residual embossing lacquer layer normally required after the NIL imprinting process through an etching step is obsolete due to the lack of residue of the described UV imprinting process.

Due to the fact that—as corresponds to a design of the invention—the embossing lacquer remaining after structuring is removed through immersion in a solvent bath or by spraying, potentially with additional mechanical means, such as brushes or ultrasound, it is possible to provide an environmentally-friendly process that is simple to perform, with which any remaining embossing lacquer can be removed without any residue. With this method and using the aforementioned embossing lacquer, it is possible to avoid any oxygen reactive-ion etching (RIE process).

Figure 1B:
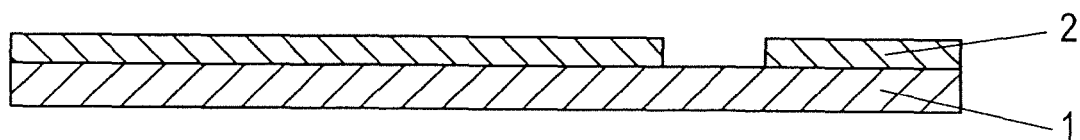
Figure 2:
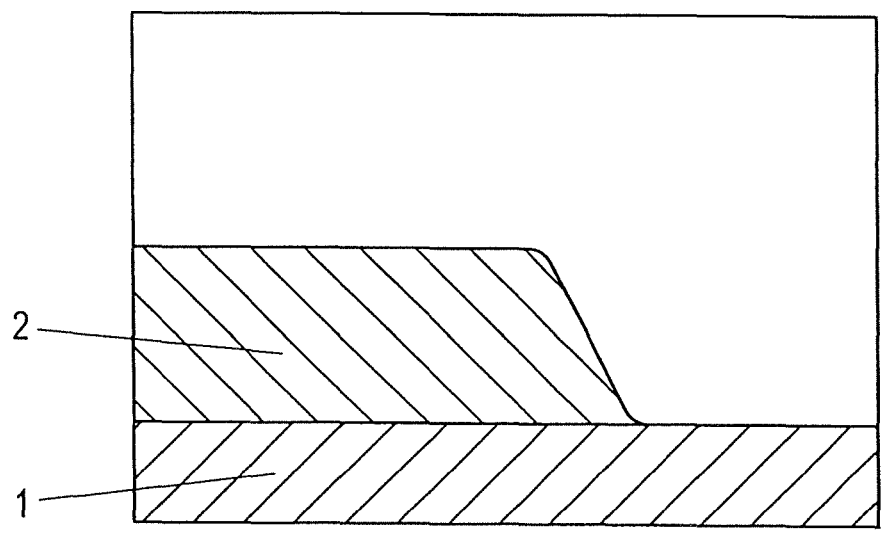
Figure 4:
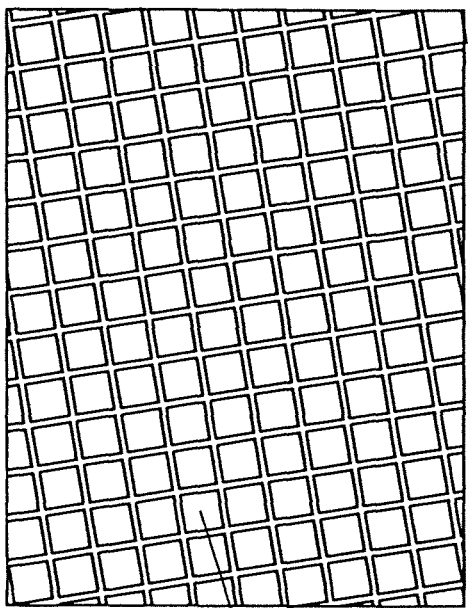
Figure 4:
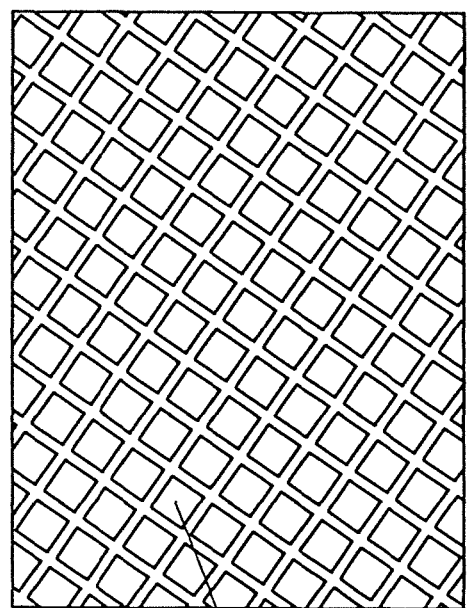
Figure 4:
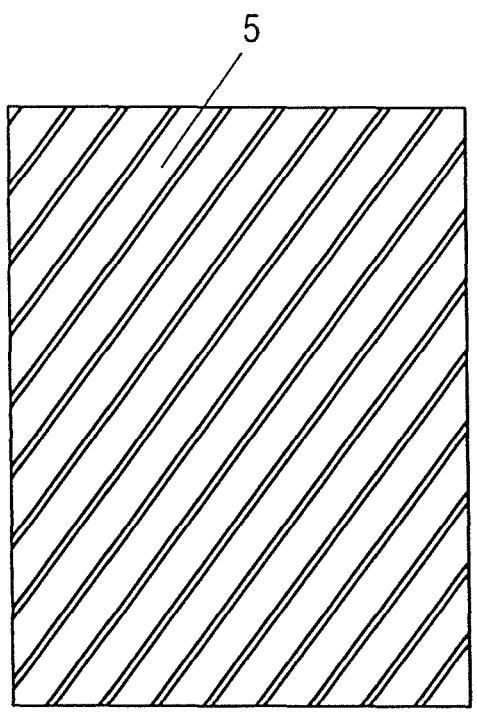
Figure 4:
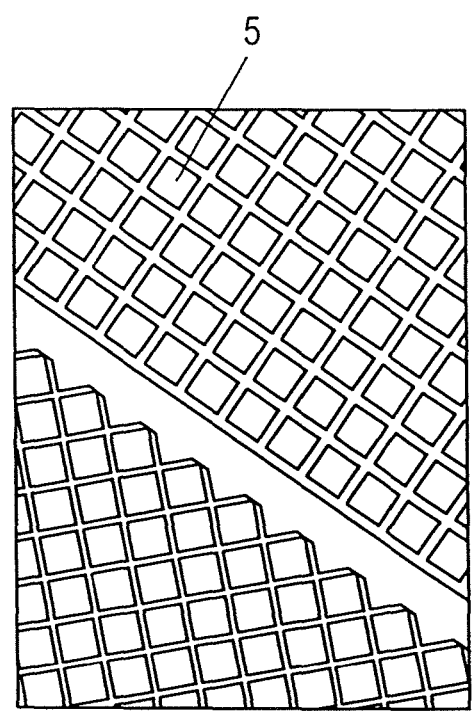

The invention will be explained in further detail below based on examples as well as design examples depicted in the drawing. The following are shown therein:

FIG. 1 a diagram of residue-free imprinting by dewetting the UV embossing lacquer, FIG. 2 a scanning electron depiction of residue-free UV-NIL imprinting of a PET foil, and FIG. 3 a diagram of the lift-off principle based on a lift-off-capable embossing lacquer according to the invention as a sacrificial layer, and FIG. 4 four scanning electron microscope images of linear or grid structures, which were produced with an embossing lacquer according to the invention.

FIG. 1 shows that a substrate 1 is coated with a UV embossing lacquer 2 based on acrylate, which also contains surface-active substances. When an embossing stamp 3 approaches, the splitting coefficient, i.e. the interfacial energy between substrate 1 and stamp 3 less the interfacial energy between substrate 1 and embossing lacquer 2 and between embossing lacquer 2 and stamp 3 becomes negative due to the wetting properties of embossing lacquer 2, through which embossing lacquer 2 retracts between the stamp surface and substrate 1 as is depicted in FIG. 1b, which shows the hardened UV embossing lacquer after removing embossing stamp 3, embossing lacquer 2 of which has a gap 4 corresponding to stamp 3.

Due to this residue-free UV NIL imprinting, the oxygen reactive-ion etching step (RIE) generally required with the nanoimplantlithography process for removing any residual embossing lacquer layers on substrate 1 as is depicted in FIG. 2 is superfluous. FIG. 2 clearly shows that no remaining embossing lacquer 2 is present on substrate foil 1, which is coated with embossing lacquer 2, where embossing stamp 3 lead for dewetting the UV embossing lacquer on the substrate.

The sequence of the process steps of a lift-off process is schematically shown in FIG. 3.

In FIG. 3a, a sacrificial layer, e.g. a photo embossing lacquer 2, is applied on substrate 1. It is evident in FIG. 3b that sacrificial layer 2 was structured; namely with a negative sidewall angle in the present case.

In FIG. 3c, the entire surface of exposed substrate 1 as well as remaining sacrificial layer 2 is covered with a target material, e.g. aluminum 5.

The dissolving of the sacrificial layer or embossing lacquer 2 in a wet chemical process, in the present case, in water, is schematically shown in FIG. 3d. Sacrificial layer 2 dissolves in water 6 and all areas of substrate 1, on which a sacrificial layer 2 remained in the previous steps, are exposed by sacrificial layer 2 and target material 5 located over sacrificial layer 2 is dissolved or removed together with sacrificial layer 2, such that substrate 1 remains with separated target material 5. After substrate 1 is dried, structured target material 5 on substrate 1 is ready for further use, as is depicted in FIG. 3e.

Images of structured target materials 5 are depicted in FIG. 4, wherein this involves scanning electron microscope images, for which aluminum was used as the structured target material. The remaining line width is 400 nm. From the photographs of the scanning electron microscope, it is evident that sharp structures of the line pattern can be achieved with the embossing lacquer according to the invention or the method for imprinting and that no residues of the embossing lacquer layer are left on the surface of the structures.

EXAMPLE 1

Production of an Embossing Lacquer According to the Invention

84% acryloylmorpholine (ACMO), 10% 2-Ethylhexyl thioglycolate, 5% 2-Hydroxy-2-methyl-1-phenyl propane-1-one as a photoinitiator as well as 1% polysiloxane surfactant are applied to a 50 μm thick PET foil by means of gravure printing, wherein the pick-up volume of the gravure printing roller is 1.6 ml/m$^2$, which roughly corresponds to a 0.8 μm wet layer thickness and are imprinted with a nickel imprinting tool with protruding imprinting structures with a 5 μm structural width and 1 μm structural height with a speed of 10 m/min. The pneumatic pressure on the counter roller is 4 bar. UV polymerization occurred through irradiation with a medium-pressure mercury-vapor lamp with 100 W/cm.

EXAMPLE 2

Production of an Embossing Lacquer According to the Invention

84% IOBA, 10% 2-Glycol di(3-mercaptopropionate), 5% 2-Hydroxy-2-methyl-1-phenyl propane-1-one as a photoinitiator as well as 1% 1H,1H,2H,2H-perfluoroctylacrylate are applied to a 50 µm thick PET foil by means of gravure printing, wherein the cell volume of the gravure printing roller is 1.6 ml/m$^2$, which roughly corresponds to a 0.8 µm wet layer thickness and are imprinted with a nickel imprinting tool with protruding imprinting structures with a 5 µm structural width and 1 µm structural height with a speed of 10 m/min. The pneumatic pressure on the counter roller is 4 bar. UV polymerization occurred through irradiation with a medium-pressure mercury-vapor lamp with 100 W/cm.

EXAMPLE 3

Production of an Embossing Lacquer According to the Invention

84% acryloylmorpholine (ACMO), 10% dodecanethiol, 5% ethyl(2,4,-trimethylbenzoyl) phenylphosphinate as a photoinitiator as well as 1% 1H,1H,2H,2H-perfluoroctylacrylate are applied to a 50 µm thick PET foil by means of gravure printing, wherein the cell volume of the gravure printing roller is 1.6 ml/m$^2$, which roughly corresponds to a 0.8 µm wet layer thickness and are imprinted with a nickel imprinting tool with protruding imprinting structures with a 5 µm structural width and 1 µm structural height with a speed of 10 m/min. The pneumatic pressure on the counter roller is 4.2 bar. UV polymerization occurred through irradiation with a medium-pressure mercury-vapor lamp with 100 W/cm.

EXAMPLE 4

Production of an Embossing Lacquer According to the Invention

84% IBOA, 10% 2-Ethylhexyl thioglycolate, 5% ethyl(2, 4, trimethylbenzoyl)phenylphosphinate as a photoinitiator as well as 1% siloxane-based Gemini surfactant are applied to a 50 µm thick PET foil by means of gravure printing, wherein the cell volume of the gravure printing roller is 1.6 ml/m$^2$, which roughly corresponds to a 0.8 µm wet layer thickness and are imprinted with a nickel imprinting tool with protruding imprinting structures with a 5 µm structural width and 1 µm structural height with a speed of 10 m/min. The pneumatic pressure on the counter roller is 3.8 bar. Die UV cross-linking occurred through irradiation with a medium-pressure mercury-vapor lamp with 100 W/cm.

EXAMPLE 5

The structures manufactured according to Example 1 are metalized through vapor-depositing 30 nm of nickel and after metallization, the embossing lacquer structures are removed by introducing the metalized foil into a water bath and heating to temperatures of 40° C. and using additional measures, such as ultrasound, spraying, brushing, etc. With this treatment, the embossing lacquer, which is water-soluble, is dissolved and the metallic layer located over the embossing lacquer is simultaneously removed with the embossing lacquer, while the metallic layer areas located directly on the foil areas exposed in the previous imprinting step remain on the foil. Thus, only a negative metallic structure of the imprinted embossing lacquer structure remains after the lift-off process.

EXAMPLE 6

The structures manufactured according to Example 3 are metalized through vapor-depositing 30 nm of aluminum and after metallization, the excess embossing lacquer structures are removed by applying ultrasound in a water bath. With this treatment, the water-soluble embossing lacquer is dissolved and the metallic layer located over the embossing lacquer is simultaneously removed with the embossing lacquer, such that only a negative profile of the imprinted profile remains after the lift-off process, which consists exclusively of a metallic structure.

EXAMPLE 7

The structures manufactured in this way are metalized through vapor-depositing 30 nm of chromium and after metallization, the excess embossing lacquer structures are removed by introducing the metalized structure into a water bath and heating to temperatures of 60° C. by spraying and pressure through the application of ultrasound and using additional measures, vibration, brushing, etc. With this treatment, the embossing lacquer, which is water-soluble, is dissolved and the metallic layer located over the embossing lacquer is simultaneously removed with the embossing lacquer, such that only a negative profile of the imprinted profile remains after the lift-off process, which consists exclusively of a metallic structure.

EXAMPLE 8

The structures manufactured according to Example 2 are metalized through vapor-depositing 30 nm of aluminum and after metallization the excess embossing lacquer structures are removed by introducing the metalized structure in propylene glycol monomethyl ether acetate (PGMEA) and heating to temperatures of 50° C. using additional measures, vibration, brushing, etc. With this treatment, the embossing lacquer, which is soluble in solvent, is dissolved and the metallic layer located over the embossing lacquer is simultaneously removed with the embossing lacquer, such that only a negative profile of the imprinted profile remains after the lift-off process, which consists exclusively of a metallic structure.

EXAMPLE 9

The structures manufactured according to Example 4 are coated through vapor-depositing 30 nm of P3HT and after coating the excess embossing lacquer structures are removed by introducing the coated structure into a water bath and heating to temperatures of 50° C. or by spraying the water and through pressure. With this treatment, the embossing lacquer is dissolved and the semiconductor layer located over the embossing lacquer is simultaneously removed with the embossing lacquer, such that only a negative profile of the imprinted profile remains after the lift-off process, which consists exclusively of an organic semiconductor structure.

EXAMPLE 10

The structures manufactured according to Example 4 are coated through vapor-depositing 30 nm of ZnO and after coating the excess embossing lacquer structures are removed by introducing the coated structure in propylene glycol monomethyl ether acetate (PGMEA) and heating to temperatures of 50° C. or by spraying the solvent and through pressure. With this treatment, the embossing lacquer is dissolved and the semiconductor layer located over the embossing lacquer is simultaneously removed with the embossing lacquer, such that only a negative profile of the imprinted profile remains after the lift-off process, which consists exclusively of an inorganic semiconductor structure.

What is claimed is:

1. An embossing lacquer based on a UV-polymerizable prepolymer composition containing at least one acrylate monomer, wherein the prepolymer composition contains a thiol, selected from the group consisting of 3-Mercaptopropionates, mercaptoacetates, thioglycolates, and alkyl thiols, as well as a surface-active anti-adhesive additive selected from the group consisting of mono-functional polydimethylsiloxane (meth) acrylates, perfluoro-n-alkyl (meth) acrylates and perfluoropolyether (meth) acrylates, as well as a photoinitiator,
   wherein the surface-active anti-adhesive additive is contained in a quantity of 0.1 wt % to 3 wt % of the UV-polymerizable prepolymer composition, and
   wherein the embossing lacquer is water soluble after polymerization.

2. The embossing lacquer according to claim 1, wherein the acrylate monomer is selected from the group consisting of acryloylmorpholine (ACMO) and isobornyl acrylate (IBOA).

3. The embossing lacquer according to claim 1, wherein the thiol is contained in the prepolymer composition in a quantity between 0.5 and 20 wt % of the UV-polymerizable prepolymer composition.

4. The embossing lacquer according to claim 1, wherein the photoinitiator is selected from the group consisting of thioxanthones, ketosulfones, (alkyl) benzoyl phenyl phosphine oxides, 1-Hydroxy alkyl phenyl ketones and 2,2-Dimethoxy-1,2-diphenylethane-1-one.

5. The embossing lacquer according to claim 4, wherein the photoinitiator is contained in a quantity of 0.1 to 10 wt %, of the UV-polymerizable prepolymer composition.

6. The embossing lacquer according to claim 1, wherein the thiol is selected from the group consisting of a mono or dithiol of the group: octanethiol, 1,8-Octanedithiol, decanethiol, 1,10-Decanedithiol, dodecanethiol, 1,12-Dodecanedithiol, 2-Ethylhexyl mercaptoacetate, 2-Ethyl-hexyl-3-mercaptopropionate, 2-Ethylhexyl thioglycolate, glycol di-(3-mercaptopropionate), glycol di(mercaptoacetates), glyceryl dimercaptoacetate and glyceryl di-(3-mercaptopropionate).

7. The embossing lacquer according to claim 1, wherein the prepolymer composition has a viscosity between 10 and 100 mPas.

8. The embossing lacquer according to claim 5, wherein the photoinitiator is contained in a quantity of 0.5 to 5 wt % of the UV-polymerizable prepolymer composition.

* * * * *